United States Patent [19]

Tanaka et al.

[11] Patent Number: 4,619,798

[45] Date of Patent: Oct. 28, 1986

[54] METHOD OF MANUFACTURING PARTS FOR USE TO THE HEAT PROCESSING FURNACE

[75] Inventors: Takashi Tanaka, Yamagata; Kenro Hayashi, Hadano, both of Japan

[73] Assignee: Toshiba Ceramics Co., Ltd., Tokyo, Japan

[21] Appl. No.: 685,800

[22] Filed: Dec. 24, 1984

[30] Foreign Application Priority Data

Dec. 26, 1983 [JP] Japan .................................. 58-251854

[51] Int. Cl.⁴ ............................................. C04B 41/53
[52] U.S. Cl. ........................................ 264/62; 264/63;
264/65; 264/82; 264/344; 427/249
[58] Field of Search ............................ 264/65, 82, 344; 427/249, 62, 63

[56] References Cited

U.S. PATENT DOCUMENTS 4,238,434  12/1980  Enomoto et al. ..................... 264/65

FOREIGN PATENT DOCUMENTS 55-158662  12/1980  Japan .................................. 264/344
1438877   6/1976   United Kingdom ................ 427/249

OTHER PUBLICATIONS

Zakharenkov et al., Preparation and Properties of Silicon Carbide Electrical Heaters with Coatings of Beta-SiC In Iorg. Mater., vol. 12, No. 9, Sep. 1976, pp. 1290–1293.

English Abstract of Japanese Pat. 55,158,662.

*Primary Examiner*—James Derrington
*Attorney, Agent, or Firm*—Oblon, Fisher, Spivak, McClelland & Maier

[57] ABSTRACT

A method of manufacturing extremely high purity parts for use to the heating furnace comprising adding a sintering assistant of 0.5–2.0 weight % and a binder, to SiC powder which has an average particle diameter of 2 $\mu$m or less, and molding it to a predetermined form; applying the purification treatment to this molded body by placing it in the 800°–1,300° C. atmosphere of a gas which is selected from a group consisting of halogen gas and hydrogen halide; degassing the purified molded body in vacuum under a temperature higher than that employed at the purification treatment; sintering the degassed molded body, and coating an SiC film on at least part of the sintered body according to the chemical vapor deposition.

14 Claims, 1 Drawing Figure

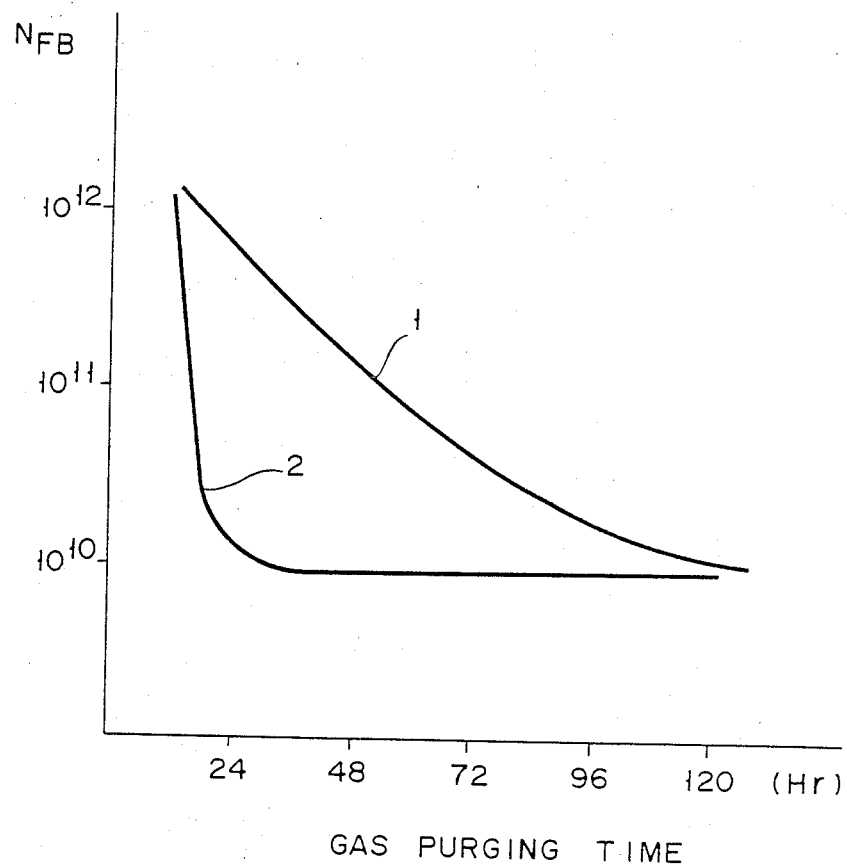
GAS PURGING TIME

METHOD OF MANUFACTURING PARTS FOR USE TO THE HEAT PROCESSING FURNACE

BACKGROUND OF THE INVENTION

The present invention relates to a method of manufacturing parts for use in a heating furnace which is employed in a heating process such as oxidation and diffusion of semiconductor wafers in the course of manufacturing the semiconductor devices and, more particularly, it relates to a method of manufacturing a process tube for a diffusion furnace.

Quartz glass and silicon carbide are well known as materials of which the process tube for the diffusion furnace is made. When using quartz glass, a process tube of high quality can be obtained, but it becomes devitrified and bent under high temperature. Therefore, it is difficult to use this process tube under a temperature higher than 1,200° C. In addition, it is also difficult to make a process tube large-sized, thereby restraining semiconductor wafers from being made large-sized. On the other hand, a process tube made of silicon carbide has good mechanical strength under high temperature, but the tube must be impregnated with silicon to make the tube gas-impenetrable. When impregnated with silicon, impurities in the tube diffuse and penetrate outside through the phase of silicon impregnated to thereby contaminate the silicon wafers which are arranged in the process tube at the diffusion process.

Further, the conventional process tube made of silicon carbide for use in the diffusion furnace is by no means satisfactory from the viewpoint of impurities. Namely, the conventional process tube made of silicon carbide is usually prepared after acid treatment, molding and purification treatment of silicon carbide powder as raw material, impregnation of high purity Si, and final acid treatment. However, it cannot be avoided that impurities are still left in the final product even if the cleaning is repeated several times as described above, and these impurities degraded the semiconductor device obtained. It was particularly difficult to remove those impurities which were confined in silicon carbide powder particles.

In order to remove these impurities, treatment was carried out at a temperature of 1,200°-1,300° C. for more than 100 hours at the gas purge step prior to the treatment of the silicon wafers, using a gas mixture of 3% HCl and $O_2$. This treatment represented a large expense and loss of time.

SUMMARY OF THE INVENTION

The object of the present invention is to provide a method of manufacturing heating furnace parts, using silicon carbide of high purity but without carrying out the purification treatment for a long time.

A method of manufacturing heating furnace parts according to the present invention comprises a step of adding a sintering assistant of 0.5–2.0 weight percent and a binder to SiC powder having an average particle diameter of less than 2 $\mu$m, and molding it to a predetermined form; a step of applying the purification treatment to this molded body by placing it in the atmosphere of a gas of 800°–1,300° C. which is selected from the group consisting of halogen gas and hydrogen halide; a step of degassing the purified molded body in a vacuum whose temperature is higher than that at the purification treatment; a step of sintering the degassed molded body; and a step of coating an SiC film on at least part of the sintered body according to the chemical vapor deposition.

As the heating furnace parts manufactured according to the method of the present invention, the process tube, paddle, boat and the like, for use to the diffusion furnace which is employed for manufacturing the semiconductor device, are included.

BRIEF DESCRIPTION OF THE DRAWING

The FIGURE is a graph showing a relationship between the gas purging time of the process tube in an atmosphere which contains HCl, and $N_{FB}$ value of semiconductor wafers into which impurities are diffused in the process tube.

DETAILED DESCRIPTION OF THE PREFERRED EMBODIMENT

A method of the present invention will be described in detail, citing an example wherein it is applied to the manufacture of the process tube for the diffusion furnace.

The present invention has been made starting from the fact that the conventional process tube made of silicon carbide was impregnated with silicon to become gas-impervious and that impurities in the process tube were discharged outside, diffusing and penetrating through the phase of silicon impregnated. In other words, the method of the present invention intends to make the process tube gas-impervious by making the process tube itself more dense but without impregnating it with silicon. This step of making the process tube more dense can be achieved by using as a raw material a powder mixture consisting of an SiC powder having an average particle diameter of 2 $\mu$m or less, preferably 0.5–1.5 $\mu$m, and a sintering assistant of 0.5–2.0 weight %, preferably 0.5–1.0 weight % based on the weight of the SiC powder. The sintering assistant includes boron and boron compounds such as boron carbide. When the sintering assistant contained by 0.5–2.0 weight % of the SiC powder is added, a process tube made of the gas-impervious SiC which has a density higher than 95% of the theoretical density of SiC can be obtained. When the sintering assistant is added less than 0.5%, no effect can be achieved. When more than 2.0%, however, the purity of the process tube is undesirably reduced. When a powder mixture of the SiC powder and the sintering assistant is molded to a tube, a binder is added thereto. The binder includes phenol resin, polyvinyl alcohol and methyl cellulose. The molding method includes rubber pressing, extrusion and slip casting.

The molded tube is then subjected to the purification treatment, which is carried out by heating the molded tube to 800°–1,300° C., preferably 900°–1,000° C., in the atmosphere of halogen gas or hydrogen halide gas. When heated at a temperature lower than 800° C., the purification treatment can not be achieved sufficiently, but when heated at a temperature higher than 1,300° C., SiC itself begins to decompose to precipitate carbon, thereby causing the molded tube to become deformed. When heated under 800°–1,300° C., impurities in the molded tube are removed as halide of low boiling point.

The molded tube cannot be sufficiently purified only by this purification treatment. When the purification treatment is applied, impurities such as iron and aluminum, for example, become iron halide and aluminum halide, but these halides can not be sufficiently separated and removed by the temperature employed. In order to sufficiently separate and remove these halides, it is necessary to further raise the temperature employed by the purification treatment, but when the temperature is raised, SiC decomposes to precipitate carbon, as described above. According to the method of the present invention, therefore, degassing is applied to the molded tube, which has been subjected to the purification treatment, in vacuum at a temperature higher than the temperature employed by the purification treatment, preferably under 1,350°–1,700° C. Impurities which have become halides but not still been separated and removed by the previous purification treatment can be removed by the degassing, and the purification of the molded tube is thus finished.

The degassed molded tube is then sintered under a high temperature of 2,050°–2,100° C., for example, in the flow of an inert gas such as argon gas, for example.

At least the inner surface of the sintered tube is then coated with an SiC film of high purity according to the chemical vapor deposition (CVD) method. The coating of this CVD film is carried out as follows. The sintered tube is positioned in an inner tube of a high frequency heating furnace of the vertical type which comprises a duplex tube consisting of an outer tube made of quartz, for example, and the inner tube made of graphite, and a high frequency heating coil arranged round the duplex tube. After the furnace is evacuated, the inner tube is induction-heated from the upper portion. When the inner tube is heated to 1,300°–1,400° C., a gas mixture of trichloromethyl silane and hydrogen is flowed into the inner tube from below through a nozzle. As a result, trichloromethyl silane decomposes to form the SiC film on the surface of the sintered tube, and a process tube is obtained as the final product for use to the heating furnace. It is preferable that the SiC film is 100–300 μm thick.

As described above, the process tube prepared according to the method of the present invention is made of high density and gas-impervious, using the SiC ultrafine powder as a raw material and adding the sintering assistant thereto. Different from the conventional process tube which was made gas-impervious by being impregnated with silicon, therefore, it can prevent impurities from being discharged outside through the silicon phase to contaminate the semiconductor wafers. In addition to the purification treatment which is carried out in the atmosphere of halogen or hydrogen halide gas, the degassing is performed in vacuum under high temperature, thereby enabling the tube to be purified without decomposing SiC. Further, at least the inner face of the tube is coated with the CVD SiC film. Therefore, impurities can be prevented from penetrating outside through the process tube. As a result, the semiconductor device can be reliably prevented from being contaminated. An example of the present invention will be described below.

EXAMPLE

Boron powder, 0.7 weight %, was added to SiC ultrafine powder whose average particle diameter was 1 μm or less and whose specific surface was more than 10 m²/gr, and phenol resin, 20 weight % based on the weight of the powder mixture, was added, as the carbon source to the mixture. The mixture thus formed was sufficiently mixed and compounded. The mixture was then granulated to have a particle diameter of 500 μm and dried. It is molded by the isostatic press to form a tube which has outer and inner diameters of 150 mm and 136 mm, respectively, and a length of 2,000 mm. The tube was placed in a purified furnace, heated to 1,000° C., purified by HCl gas for two hours, thereafter moved into another furnace and degassed for two hours, heating the inside of the furnace to 1,350° C. and keeping it 5 mmHg. The tube thus purified was sintered in a flow of argon gas under a high temperature of 2,050–2,100° C. The sintered tube was placed in the center of a duplex tube which comprises an inner graphite tube and an outer quartz tube, and the inside of the duplex tube was evacuated to 4 mmHg. The molded silicon carbide tube in the furnace was heated to 1,350° C. by means of a high frequency induction-heating coil arranged round the outer quartz tube, and trichloromethyl silane was supplied to it, using H₂ gas as the carrier gas, to thereby coat its inner surface with a CVD film of high purity SiC. The CVD film was 200 μm thick.

The process tube thus obtained for use to the diffusion furnace was evaluated according to MOS-varactor method. The evaluation was carried out by obtaining such gas purging time as needed to gain a predetermined $N_{FB}$ value in HCl atmosphere prior to diffusion, in the case where impurity was diffused into the silicon wafer in the process tube. The gas purging was carried out in O₂ gas, which contained three percent HCl, under a temperature of 1,200° C. The result is shown in the FIGURE. In the FIGURE, curve 1 represents the case of the conventional silicon-impregnated process tube and curve 2 the case of the process tube obtained in the example of the present invention. As apparent from the FIGURE, the process tube prepared according to the method of the present invention enables the gas purging time to be reduced half and has an extremely higher purity, as compared with the conventional one.

What is claimed is:

1. A method of manufacturing parts for a heating furnace comprising:
   (a) adding a sintering assistant of 0.5–2.0 wt. % and a binder, to SiC powder which has an average particle diameter of 2 μm or less, and molding it to a predetermined form:
   (b) purifying the molded body by placing it in an atmosphere consisting essentially of of halogen gas or hydrogen halide gas at a temperature in the range of 800°–1300° C.;
   (c) degassing the purified molded body in a vacuum under a temperature higher than that employed during said purification;
   (d) sintering the degassed molded body; and
   (e) coating a SiC film on at least part of the sintered body by chemical vapor deposition.

2. The method according to claim 1, wherein said SiC powder has an average particle diameter of 0.5–1.5 μm.

3. The method according to claim 1, wherein said sintering assistant is at least one selected from the group consisting of boron and boron carbide.

4. The method according to claim 1, wherein the amount of said sintering assistant ranges from 0.5%–1.0%.

5. A method according to claim 1, wherein said binder is at least one selected from the group consisting of phenol resin, polyvinyl alcohol and methyl cellulose.

6. The method according to claim 1, wherein said molding is effected by rubber pressing, extrusion or slip casting.

7. The method according to claim 1, wherein the temperature employed during purification ranges from 900° C.–1000° C.

8. The method according to claim 1, wherein said halogen gas is selected from the group consisting of chlorine, bromine and fluorine.

9. The method according to claim 1, wherein said hydrogen halide gas is selected from the group consisting of hydrogen chloride, hydrogen bromide and hydrogen fluoride.

10. The method according to claim 1, wherein said degassing is carried out at a temperature of 1,350°–1,700° C.

11. The method according to claim 1, wherein said sintering is carried out at a temperature of 2,050°–2,100° C.

12. The method according to claim 1, wherein said SiC film is 100–300 μm thick.

13. The method according to claim 1, wherein said heating furnace parts are diffusion furnace parts.

14. The method according to claim 13, wherein said diffusion furnace parts are a process tube, a paddle or a boat.

* * * * *